United States Patent
Lee et al.

(10) Patent No.: US 9,927,719 B2
(45) Date of Patent: *Mar. 27, 2018

(54) OVERLAY SAMPLING METHODOLOGY

(71) Applicant: Taiwan Semiconductor Manufacturing Co., Ltd., Hsin-Chu (TW)

(72) Inventors: Yung-Yao Lee, Zhubei (TW); Ying-Ying Wang, Xin-Zhu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 44 days.

This patent is subject to a terminal disclaimer.

(21) Appl. No.: 14/882,493

(22) Filed: Oct. 14, 2015

(65) Prior Publication Data

US 2016/0033878 A1    Feb. 4, 2016

Related U.S. Application Data

(63) Continuation of application No. 13/778,386, filed on Feb. 27, 2013, now Pat. No. 9,176,396.

(51) Int. Cl.
  *G03F 7/20* (2006.01)
  *G01B 11/14* (2006.01)
(52) U.S. Cl.
  CPC .......... *G03F 7/70633* (2013.01); *G01B 11/14* (2013.01)
(58) Field of Classification Search
  CPC ........................... G01B 11/14; G03F 7/70633
  (Continued)

(56) References Cited

U.S. PATENT DOCUMENTS 5,877,861 A    3/1999  Ausschnitt et al.
5,978,085 A    11/1999 Smith et al.
(Continued)

FOREIGN PATENT DOCUMENTS

TW              563042        11/2003
WO    WO 2012080008 A2  *  6/2012    ............... G03F 1/72

OTHER PUBLICATIONS

Non-Final Office Action dated Oct. 2, 2014 for U.S. Appl. No. 13/778,386.

(Continued)

*Primary Examiner* — Gordon J Stock, Jr.
(74) *Attorney, Agent, or Firm* — Eschweiler & Potashnik, LLC

(57) ABSTRACT

One embodiment relates to a method for overlay sampling. The method provides a number of fields over a semiconductor wafer surface. An inner subgroup of the number of fields includes fields in a central region of the wafer surface. An outer subgroup of the number of fields includes neighboring fields near a circumferential edge of the wafer surface. The method measures a first number of overlay conditions at a corresponding first number of overlay structures within a field of the inner subgroup. The method also measures a second number of overlay conditions at a corresponding second number of overlay structures within a field of the outer subgroup. The second number is greater than the first number. Based on the measured first number of overlay conditions and the measured second number of overlay conditions, the method determines an alignment condition for two or more layers on the semiconductor wafer surface.

20 Claims, 6 Drawing Sheets

(58) Field of Classification Search
USPC .......... 356/399–401; 382/151; 250/548;
355/53, 55, 77; 430/5, 22, 30; 438/5, 7,
438/16; 700/28, 29, 30, 31, 124, 125;
706/14
See application file for complete search history.

(56) References Cited

U.S. PATENT DOCUMENTS

| | | | |
|---|---|---|---|
| 6,541,283 B1 | 4/2003 | Leroux | |
| 6,638,671 B2 | 10/2003 | Ausschnitt et al. | |
| 6,639,676 B1 | 10/2003 | Leroux | |
| 6,899,982 B2 | 5/2005 | McArthur et al. | |
| 6,948,149 B2 | 9/2005 | Goodwin | |
| 6,975,974 B2 | 12/2005 | Chien et al. | |
| 7,908,105 B2 | 3/2011 | Lee et al. | |
| 8,703,368 B2 | 4/2014 | Lee et al. | |
| 8,837,810 B2 | 9/2014 | Chen et al. | |
| 8,982,320 B2 | 3/2015 | Okita | |
| 9,164,398 B2* | 10/2015 | Lee | G03F 7/70633 |
| 9,176,396 B2* | 11/2015 | Lee | G03F 7/70633 |
| 2004/0101984 A1 | 5/2004 | Heine et al. | |
| 2004/0233402 A1* | 11/2004 | Smith | G03F 7/70633 355/52 |
| 2007/0133864 A1* | 6/2007 | Morimoto | G03F 9/7003 382/151 |
| 2008/0176045 A1* | 7/2008 | Zhang | G03F 7/70641 428/195.1 |
| 2008/0228435 A1 | 9/2008 | Lee et al. | |
| 2010/0110401 A1* | 5/2010 | Chung | G03F 7/70641 355/55 |
| 2014/0031969 A1 | 1/2014 | Baseman et al. | |
| 2014/0036243 A1* | 2/2014 | Beyer | G03F 1/72 355/52 |
| 2014/0240706 A1 | 8/2014 | Lee et al. | |
| 2015/0015870 A1 | 1/2015 | Lin et al. | |
| 2015/0043803 A1 | 2/2015 | Jeong | |
| 2015/0067617 A1 | 3/2015 | Chang et al. | |

OTHER PUBLICATIONS

Final Office Action dated Apr. 9, 2015 for U.S. Appl. No. 13/778,386.

Notice of Allowance dated Jul. 1, 2015 for U.S. Appl. No. 13/778,386.

* cited by examiner

OVERLAY SAMPLING METHODOLOGY

REFERENCE TO RELATED APPLICATION

This Application is a Continuation of U.S. application Ser. No. 13/778,386 filed on Feb. 27, 2013, the contents of which are incorporated by reference in their entirety.

BACKGROUND

Silicon wafers are currently manufactured in a sequence of steps, where each step places a pattern of material on the wafer. By building up successive layers of patterned metal, patterned insulators, patterned photoresist, etc.; transistor structures and/or other structures can be formed. In order for a final device to function correctly, these patterns for successive layers must be aligned correctly. For example, a contact layer, which resides vertically between an upper metal layer and a lower contact area, must be laterally arranged within a lateral width of the upper metal line and lower contact area, such that the contact layer when formed extends vertically between the metal line and contact area to form an electrical connection there between (e.g., ohmic connection). Misalignment of any kind can cause short circuits and/or connection failures, which in turn impact fab yield and profit margins.

Overlay control, sometimes abbreviated as OVL, defines the control of this pattern-to-pattern alignment between different layers. It plays an important role in semiconductor manufacturing, helping to monitor layer-to-layer alignment on multi-layer device structures.

DETAILED DESCRIPTION

Figure 1:
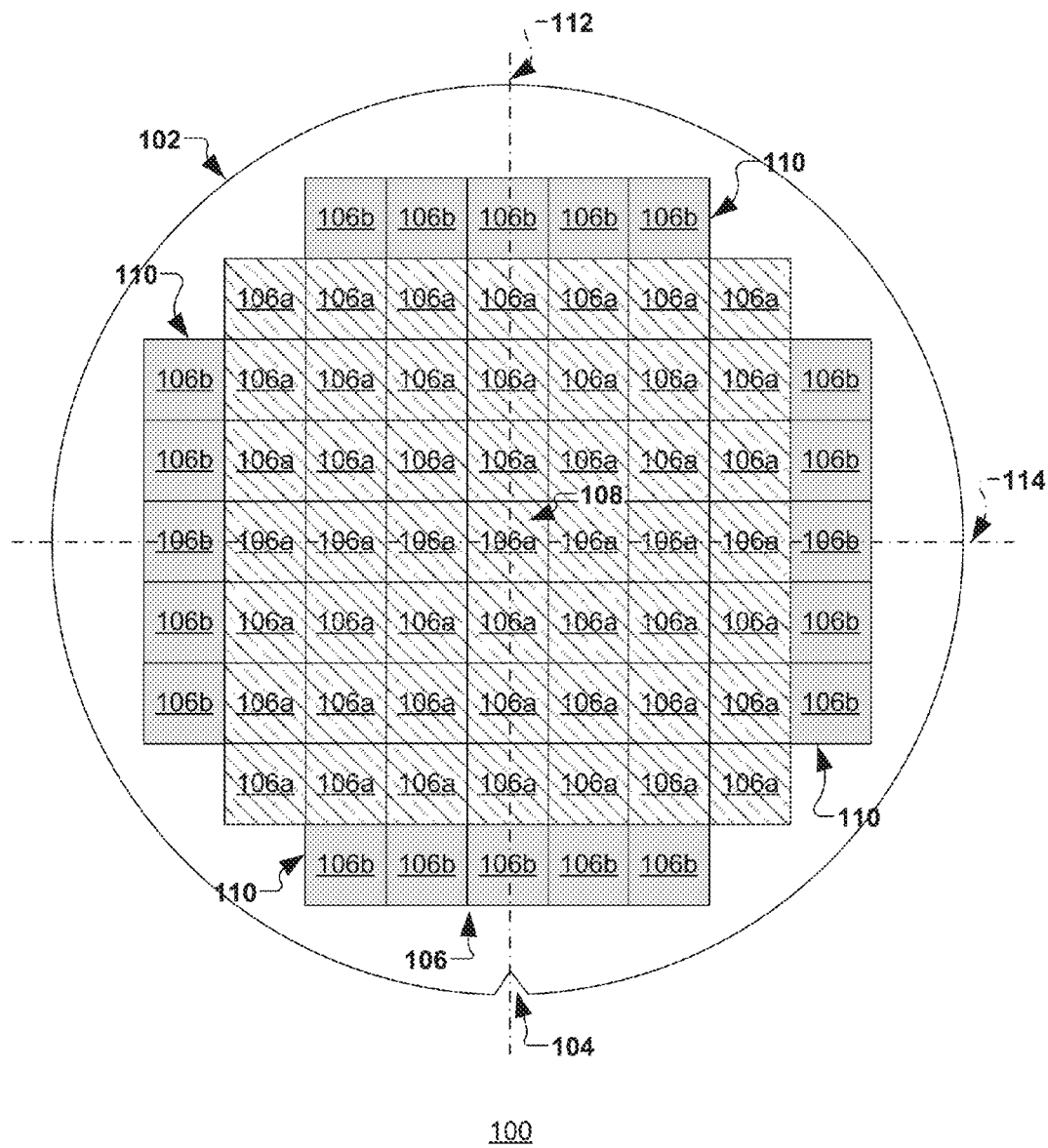
FIG. 1 shows some embodiments of a semiconductor wafer that includes central regions and outer regions on which overlay sampling is carried out.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

FIG. 1 shows a semiconductor wafer 100, which can include two or more overlying patterned layers that each includes device features. The wafer 100 includes a circumferential edge 102 including an alignment notch 104, which is used to provide coarse alignment for the wafer features during processing. Although the alignment notch 104 aids in alignment, there can still be some small misalignment issues due to imprecision or "slop" in how the alignment notch 104 is positioned for each of the patterned layers. At small geometries used for modern feature sizes, this misalignment can result in short circuit connections and/or connection failures.

To quantify misalignment (and to thereby allow for correction of detected misalignment), each patterned layer on the wafer 100 includes overlay structures, such as alignment marks. These overlay structures are arranged in a number of fields 106 spread over the wafer surface. A central region 108 of the wafer surface includes inner fields 106a, and an outer region 110 of the wafer surface near the circumferential wafer edge 102 includes outer fields 106b. Each field 106 is depicted as a square having an area that is equal to areas of the other fields (e.g., other squares), and the fields are arranged in a grid-like fashion so edges of neighboring fields abut one another. The inner fields 106a and outer fields 106b are both symmetric about a first diametric axis 112 and a second diametric axis 114, wherein the second diametric axis 114 is perpendicular to the first diametric axis 112.

To verify alignment during processing, each field 106 includes one or more overlay structures, such alignment marks, arranged therein. These overlay structures are strategically positioned within a field 106 to allow misalignment to be quantified between two or more patterned layers on the wafer 100. Advantageously, the techniques of the present disclosure measure a first number of overlay conditions at a corresponding first number of overlay structures arranged within a central field 106a, and measure a second, larger number of overlay conditions at corresponding second number of overlay structures arranged with an outer field 106b. For example, in one embodiment, only a single overlay condition can be measured for each of the central fields 106a within central region 108, while multiple overlay conditions can be measured for multiple overlay structures for each of the outer fields 106b in the outer region 110. Based on these measured overlay conditions, the OVL techniques set forth herein can detect and/or quantify misalignment between layers. Compared to conventional approaches where the same number of overlay conditions are measured for all sampled fields, the techniques set forth herein offer an advantage in that measuring fewer overlay conditions for the central fields 106a helps to reduce the time required for wafer alignment, thereby increasing the number of wafers per hour passed through the fab. At the same time, measuring more overlay conditions for outer fields 106b still promotes extremely accurate alignment.

In some embodiments, an overlay condition is measured for at least one overlay structure within each central field 106a and for at least one overlay structure within each outer field 106b. These embodiments, which can achieve so-called 100% coverage (or close to 100% coverage—such as 75% coverage, 85% coverage, or 95% coverage, for example, if fewer than all fields are measured), allow accurate monitoring of wafer topography during processing. For example, warpage of the wafer 100, if any, can be detected, as can thickness and/or non-uniformity of layers due to chemical mechanical polishing (CMP), etching, or other process steps. In comparison, although conventional OVL techniques tend to measure a greater number of overlay conditions for each field (which tends to increase the overall number of samples and decrease WPH relative to the present techniques), they also often measure overlay conditions for less than 25% of all fields on the wafer surface for example. Thus, the present disclosure provides improved wafer topography measuring relative to conventional approaches.

Figure 2:
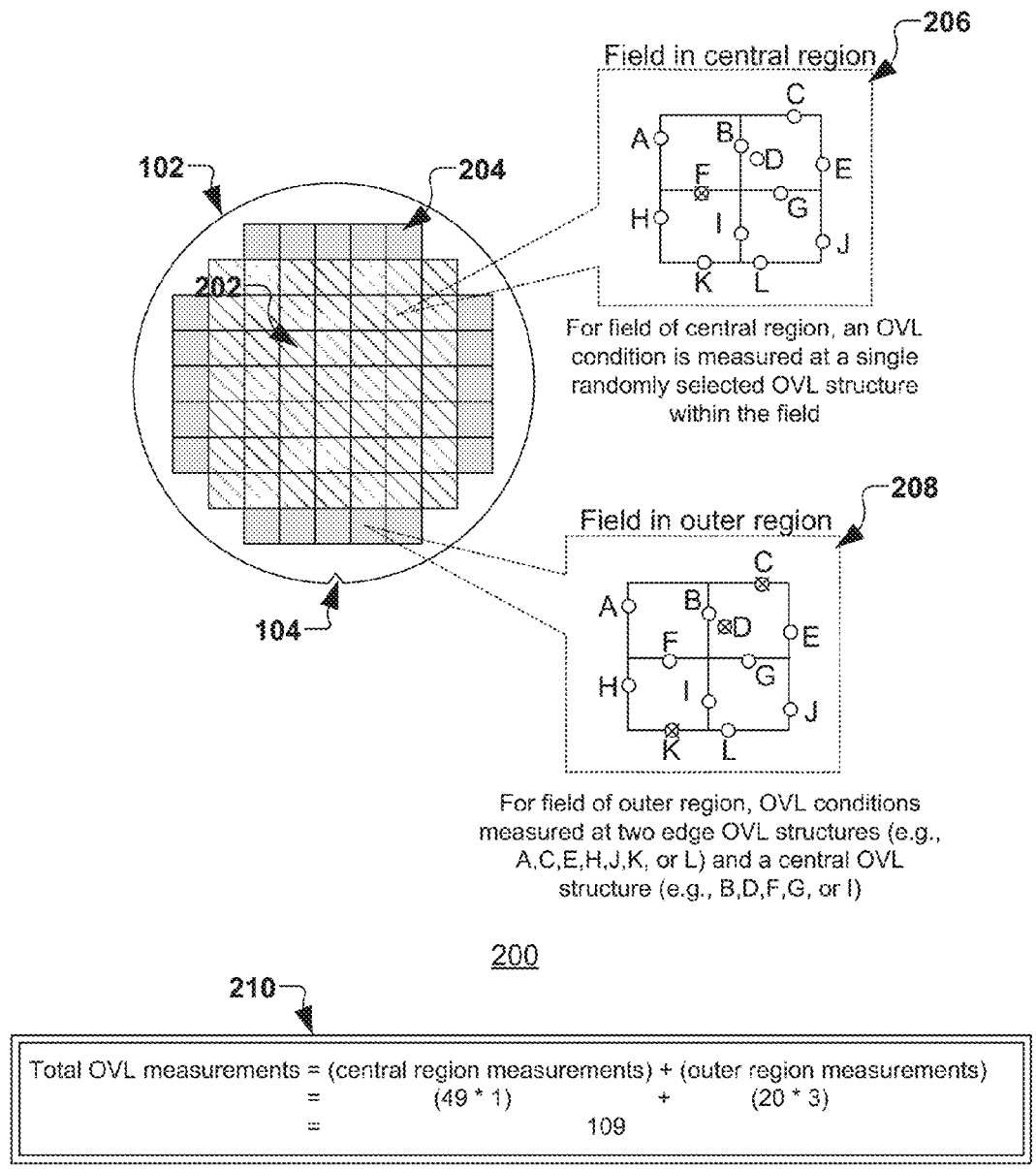
FIG. 2 shows a more detailed example of an embodiment of carrying out overlay sampling on a semiconductor wafer that includes central regions and outer regions.

FIG. 2 shows a more detailed embodiment of an overlay sampling methodology. Like FIG. 1, FIG. 2 shows a wafer 200 with central fields 202 and outer fields 204 superimposed thereon. For purposes of clarity, forty-nine inner fields are shown, along with twenty outer fields. In addition to these fields, FIG. 2 illustrates a first sample OVL pattern 206 illustrating the locations of overlay structures within a central field 202, and a second sample OVL pattern 208 illustrating the locations of overlay structures within an outer field 204. For convenience, the sample OVL patterns 206, 208 are illustrated as having the same configuration as one another, although in other embodiments a first OVL pattern can be used for the central fields 202 and a second, different OVL pattern can be used for the outer fields 204. In other embodiments, individual central fields 202 can have their overlay structures arranged in different OVL patterns from one another; and individual outer fields 204 can have their overlay structures arranged in different OVL patterns from one another.

Within a given field, the illustrated OVL patterns 206, 208 include twelve OVL structures (as represented by A, B, C, D, . . . , and L in pattern). These OVL samples are divided between one or more edge OVL structures and one or more center OVL structures. For example, in FIG. 2's OVL sampling patterns 206, 208, there are seven edge OVL structures (e.g., A, C, E, H, J, K, and L) and five center OVL structures (e.g., B, D, F, G, and I). The OVL sampling patterns can vary widely in the number of OVL structures and their positions within a given field, and thus nothing in FIG. 2's OVL patterns should be construed as limiting.

In some embodiments, more overlay conditions are measured on an outer field 204 than a central field 202, which provides good tradeoffs between accurate alignment and good wafer throughput. In FIG. 2's example, alignment between two layers is determined by measuring an overlay condition at a single, randomly selected, overlay structure for each central field 202 (e.g., in OVL pattern 206 the randomly selected OVL structure for inner field is represented by an "X" on OVL structure F); and by measuring an overlay condition at three overlay structures for each outer field 204 (e.g., in OVL pattern 208, overlay conditions are measured at OVL structures C, D, and K). For the outer fields 204, the overlay conditions can be measured at the same predetermined locations for each of the outer fields, or can follow some predetermined pattern over the wafer where different outer fields can have OVL conditions measured at different locations, or can have random locations for the OVL measurements.

For purposes of clarity, FIG. 2 describes an example where a total of one-hundred-and-nine OVL measurements are taken to align two layers on the wafer (see 210). This total of one-hundred-and-nine was arrived at by measuring a single OVL condition for each of the inner fields in 202 (i.e., 1 measurement for each of forty nine inner fields=49 measurements), and by measuring three OVL conditions for each outer field in 204 (i.e., 3 measurements for each of twenty inner fields=60 measurements). As mentioned, the inner OVL measurements 202 can be at a random overlay structure within each inner field 202. The three OVL measurements for the outer fields 204 are divided such that two OVL measurements are taken along the edges of the outer field (e.g., C and K) and the third OVL measurement is taken in a central region of the outer field (e.g., D). For comparison, a conventional OVL sampling methodology performed measurements for only seventeen of the total fields, but took measurements at all twelve OVL structures for each of these fields such that two-hundred and four total samples were taken to align each pair of two layers on the wafer. Therefore, the illustrated embodiment, which uses only one-hundred-and-nine OVL measurements for each wafer, cuts time for OVL measurements by approximately one-half, and provides a corresponding increase in wafer throughput.

Although FIGS. 1-2 show examples having a central region 202 and an outer region 204, both of which contribute to a total of sixty-nine square fields spread over a wafer, these examples do not limit the present disclosure in any way. In other embodiments, other number of fields could be used—including fewer fields (two, four, nine, twenty, etc.) or more fields (e.g., two hundred, a thousand, ten thousand, etc.). Further, although the fields are illustrated as equally sized squares, the fields could have other polygonal shapes and/or could have different areas from one another, and need not abut one another at their edges. In some embodiments, the fields can correspond to die on the wafer in a one-to-one manner, but in other embodiments a field can include multiple die, or a field can include only a fraction of a die. Further, although the inner fields and outer fields are illustrated as being symmetric about first and second diametric axes, in other embodiments the inner and outer fields may be asymmetric with regards to the first and second diametric axes.

Figure 3:
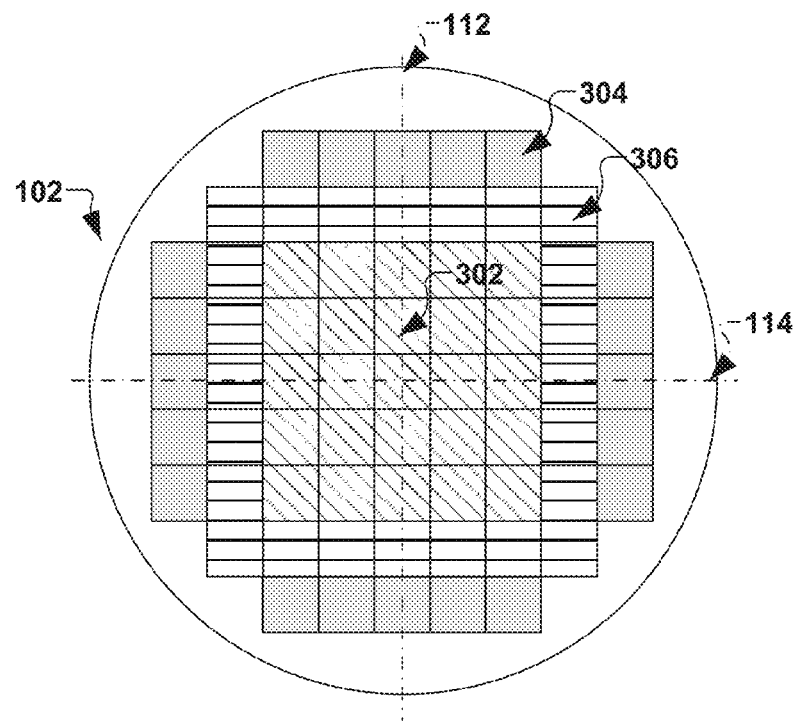
FIG. 3 shows some embodiments of a semiconductor wafer that includes an intermediate region between central and outer regions on which overlay sampling is carried out.
Figure 4:
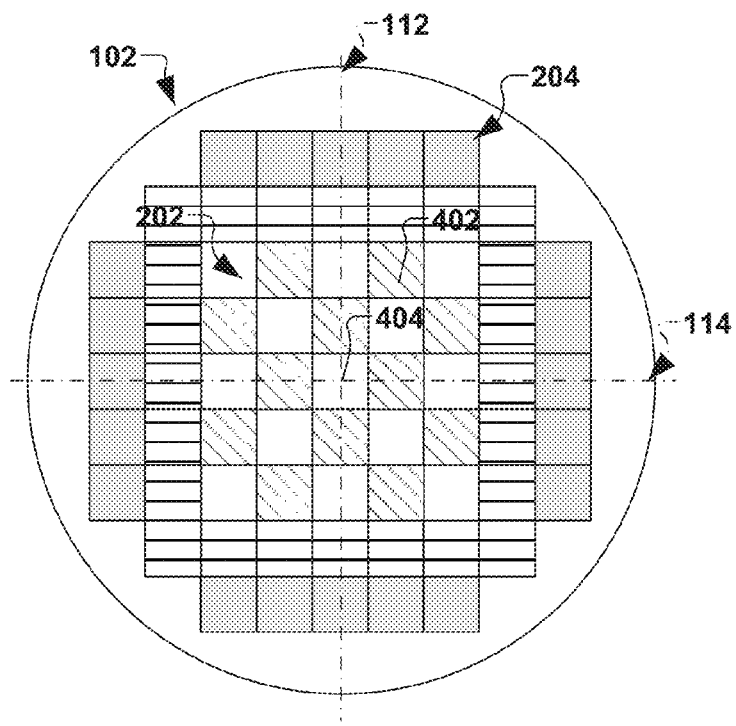
FIG. 4 shows some embodiments of a semiconductor wafer on which overlay sampling is carried out on less than all central fields in a central region of the wafer.

FIGS. 3-4 illustrate some alternative embodiments of arrangements of fields. FIG. 3's embodiment again includes a central region 302 made up of central fields and an outer region 304 made up of outer fields; but also includes an intermediate region 306 arranged between the central region 302 and outer region 304. The intermediate region 306 is made up of intermediate fields, which separate the central fields from the outer fields. The intermediate region 306 can have an OVL sampling pattern that is the same as that of the inner and outer regions (see e.g., 206 and 208 in FIG. 2), or can have a different OVL sampling pattern. The OVL structures for the intermediate region 306 can be sampled a different number of times from the inner fields in the inner region and from the outer fields in the outer region. For example, in one embodiment wherein each inner field is sampled a single time and each outer field is sampled three times, each intermediate field can be sampled two times. The intermediate fields are symmetric about first diametric axis 112 and second diametric axis 114, wherein the second diametric axis 114 is perpendicular to the first diametric axis 112.

FIG. 4 shows another embodiment where less than all of the central fields are sampled. In FIG. 4's implementation, only the shaded central fields (e.g., 402) are sampled, whereas the non-shaded central fields (e.g., 404) are left alone without having overlay measurements taken thereon. Thus, in contrast to FIG. 2 where each central field had a single OVL measurement performed, FIG. 4 has a single OVL measurement performed in only approximately half of the central fields. Although FIG. 4's reduction in the number of OVL measurements for the central region does reduce alignment accuracy somewhat compared to FIG. 2's embodiment, it correspondingly increases wafer throughput. Although not illustrated, alternative embodiments where less than all of the fields in outer region or intermediate region can be measured are also contemplated as falling within the present disclosure.

Figure 5A:
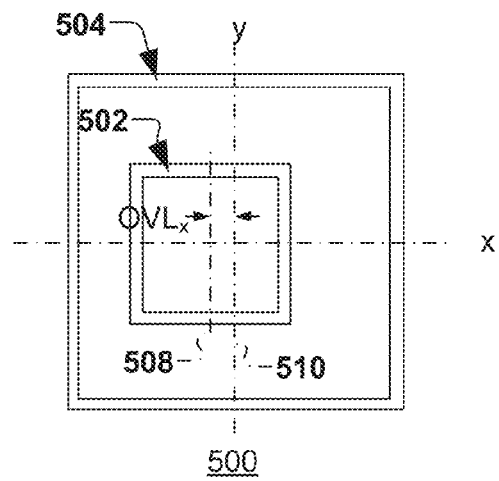
FIG. 5A shows an embodiment of a top view of a bar in bar alignment mark with an overlay offset along an x-axis.
Figure 5B:
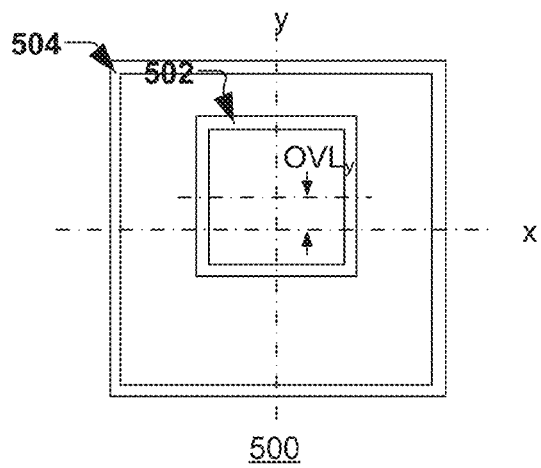
FIG. 5B shows an embodiment of a top view of a bar in bar alignment mark with an overlay offset along a y-axis.
Figure 5C:
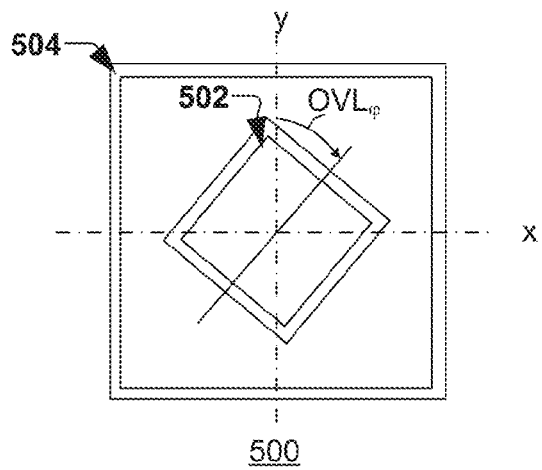
FIG. 5C shows an embodiment of a top view of a bar in bar alignment mark with a rotational overlay offset.

To provide some basic examples of how an overlay structure can detect misalignment between two or more layers on a wafer, FIGS. 5A-5C show a series of alignment marks, generally referred to as "bar-in-bar" marks, which are made up of concentric squares. FIG. 5A shows a top view of bar-in-bar mark 500 having inner and outer bar marks 502, 504, respectively, disposed on upper and lower layers, respectively. For example, lower layer on which outer bar mark 504 is formed could be a semiconductor substrate, a metal layer, a dielectric layer, or any other layer or layers; while the upper layer on which inner bar mark 502 is formed could be a photoresist layer or other mask layer formed above the lower layer, for example. In FIG. 5A, the upper and lower layers have an overlay offset (OVLx) as measured along a first axis (e.g., O) between the inner and outer bar mark centers. In FIG. 5B, the upper and lower layers have an overlay offset (OVLy) as measured along a second axis (e.g., y-axis) between the inner and outer bar mark centers. FIG. 5C shows another example where the upper and lower layers have a skewed or rotational overlay offset (OVLφ). Based on the measured overlay offsets for a number of OVL structures on the wafer, the techniques disclosed herein can characterize overlay offset so problems related to "skew" between layers can be limited. Although bar-in-bar alignment marks are discussed in FIGS. 5A-5C for purposes of explanation, it will be appreciated that a vast assortment of other alignment marks could also be used, and the present disclosure is in no way limited to bar-in-bar alignment marks.

Figure 6:
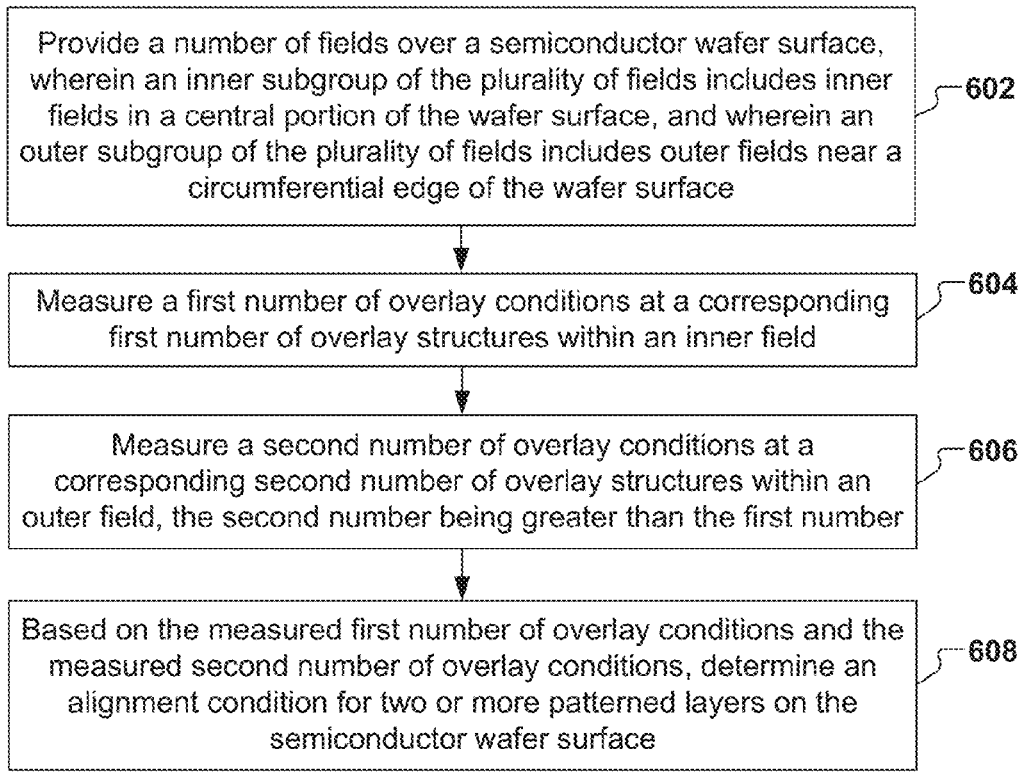
FIG. 6 is a flowchart illustrating an embodiment for a method of overlay sampling.

FIG. 6 shows an overlay methodology that provides good workpiece throughput while still providing reasonably accurate overlay measurements during processing. Method 600 starts at 602 when a number of fields is provided over a semiconductor wafer surface, wherein an inner subgroup of the plurality of fields includes inner fields in a central region of the wafer surface, and wherein an outer subgroup of the plurality of fields includes outer fields near a circumferential edge of the wafer surface.

At 604, a first number of overlay conditions is measured at a corresponding first number of overlay structures within an inner field.

At 606, a second number of overlay conditions is measured at a corresponding second number of overlay structures within an outer field, the second number being greater than the first number.

At 608, based on the measured first number of overlay conditions and the measured second number of overlay conditions, determining an alignment condition for two or more patterned layers on the semiconductor wafer surface.

Figure 7:
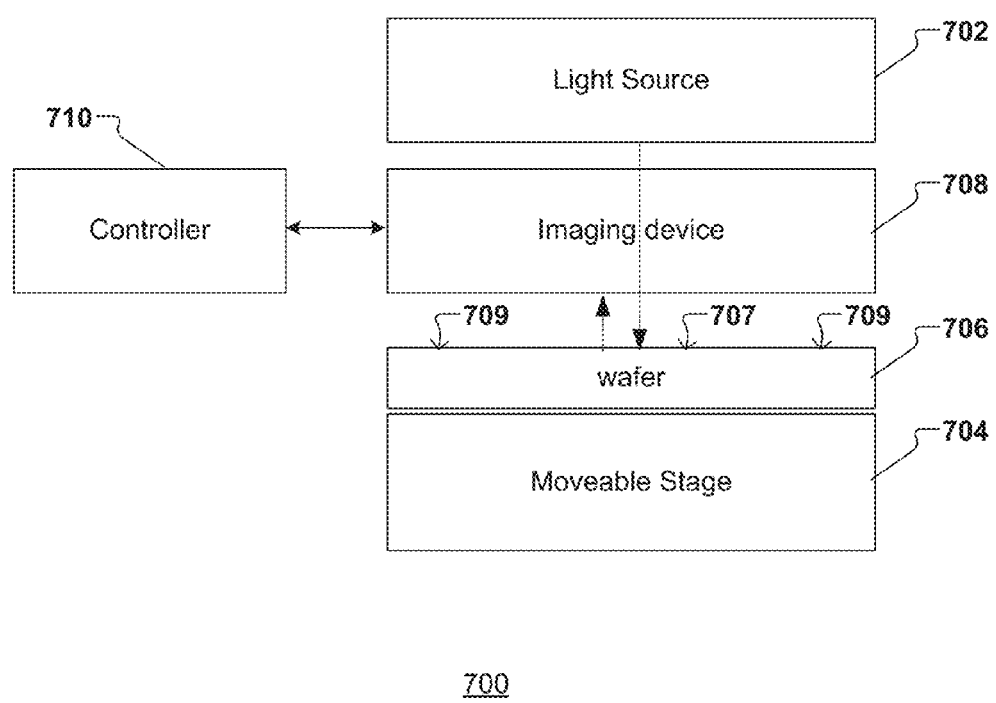
FIG. 7 shows an embodiment of a metrology system that makes use of an overlay sampling methodology.

FIG. 7 illustrates an embodiment of a metrology system for performing OVL sampling. The metrology system 700 includes a light source 702 to provide light towards an optical axis of the metrology system. A moveable stage 704 is arranged with regards to the light source 702 to retain a wafer 706 thereon such that light from the light source 702 impinges on one or more overlay structures on the wafer 706. The wafer 706 includes a central region 707 made up of inner fields and an outer region 709 made up of outer fields. An imaging device 708 is arranged to measure a first number of overlay conditions at a corresponding first number of overlay structures within an inner field. The imaging device 708 is further arranged to measure a second number of overlay conditions at a corresponding second number of overlay structures within an outer field. The second number is greater than the first number.

In some embodiments, a controller 710 is included in the metrology system to determine wafer topography for the semiconductor wafer 706 based on the measured first number of overlay conditions and the measured second number of overlay conditions. In some implementations, the controller 710 can determine an alignment condition for two or more patterned layers on the wafer based on the measured first number of overlay conditions and the measured second number of overlay conditions.

Thus it will be appreciated that some embodiments relate to a method for overlay sampling. In this method, a plurality of fields are measured over a semiconductor wafer surface. An inner subgroup of the plurality of fields includes inner fields in a central region of the wafer surface, and an outer subgroup of the plurality of fields includes outer fields near a circumferential edge of the wafer surface. A first number of overlay conditions are measured at a corresponding first number of overlay structures within an inner field. A second number of overlay conditions are measured at a corresponding second number of overlay structures within an outer field. The second number is greater than the first number.

Other embodiments relate to a method for overlay sampling. This method provides a semiconductor wafer surface, which includes a number of fields having equal areas arranged in a grid-like pattern so neighboring fields abut one another. Each field includes multiple overlay structures each made up of two or more layers that are to be aligned. A first number of overlay conditions are measured at a corresponding first number of overlay structures for an inner subgroup of the plurality of fields. Fields of the inner subgroup are arranged in a central region of the wafer surface. A second number of overlay conditions are then measured at a corresponding second number of overlay structures for an outer subgroup of the plurality of fields. Neighboring fields of the outer subgroup are arranged near a circumferential edge of the wafer surface. The second number is greater than the first number. Based on the measured first number of overlay conditions and the measured second number of overlay conditions, an alignment condition for the two or more layers is determined.

Other embodiments relate to a metrology system. The metrology system includes a light source to provide light towards an optical axis of the metrology system. A moveable stage is configured to retain a wafer having one or more overlay structures thereon, such that light from the light source impinges on the one or more overlay structures. An imaging device is arranged to measure a first number of overlay conditions at a corresponding first number of overlay structures within an inner field on the wafer, wherein the inner field is arranged in a central region of the wafer. The imaging device is further arranged to measure a second number of overlay conditions at a corresponding second number of overlay structures within an outer field. The outer field is included in an outer region near a circumferential edge of the wafer and the second number is greater than the first number.

Although the disclosure has been shown and described with respect to a certain aspect or various aspects, equivalent alterations and modifications will occur to others of ordinary skill in the art upon reading and understanding this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for overlay sampling, comprising:
providing a plurality of fields over a semiconductor wafer surface;
using an imager to measure a first number of overlay conditions at a corresponding first number of overlay structures within a first field selected from the plurality of fields, wherein the first field is selected from a first subgroup of the plurality of fields; and
measuring a second number of overlay conditions at a corresponding second number of overlay structures within a second field selected from the plurality of fields, wherein the second field is selected from a second subgroup of the plurality of fields, the first and second subgroups being mutually exclusive and the second number being greater than the first number;
wherein the first and second subgroups are symmetric about a first diametric axis passing through a center of the wafer surface, wherein the first and second subgroups are symmetric about a second diametric axis passing through the center of the wafer surface, the second diametric axis being perpendicular to the first diametric axis; and
wherein the second subgroup establishes a perimeter enclosing the first subgroup.

2. The method of claim 1, wherein measuring the first number of overlay conditions comprises measuring only one overlay condition within the first field for alignment of a patterned layer on the wafer surface.

3. The method of claim 1, wherein the second number is at least two times as large as the first number.

4. The method of claim 1, wherein the first subgroup includes all fields within the perimeter defined by the second subgroup, and where each field in the first subgroup is measured only the first number of times for alignment of a patterned layer on the wafer surface.

5. The method of claim 1, further comprising:
determining wafer topography for the semiconductor wafer surface based on the measured first number of overlay conditions and the measured second number of overlay conditions.

6. The method of claim 1, further comprising:
based on the measured first number of overlay conditions and the measured second number of overlay conditions, determining an alignment condition for two or more patterned layers on the semiconductor wafer surface.

7. The method of claim 1, wherein the plurality of fields includes inner fields and outer fields, the inner fields being disposed in a central region of the wafer surface and the outer fields being disposed near a circumferential edge of the wafer surface.

8. The method of claim 1, further comprising:
measuring a third number of overlay conditions at a corresponding third number of overlay structures within a third field selected from the plurality of fields, wherein the third number is different from each of the first and second numbers.

9. The method of claim 7, wherein the first field corresponds to an inner field and wherein the second field corresponds to an outer field.

10. The method of claim 8,
wherein the third field is selected from a third subgroup of the plurality of fields; the third subgroup at least partially surrounds outer perimeter of the second subgroup, and the third number is greater than the second number.

11. A method for overlay sampling, comprising:
providing a plurality of fields over a semiconductor wafer surface, wherein the plurality of fields includes a central group of fields and a peripheral group of fields which surround the central group of fields;
using an imager to measure a first number of overlay conditions at a corresponding first number of overlay structures within a first field selected from the central group of fields; and
using the imager to measure a second number of overlay conditions at a corresponding second number of overlay structures within a second field selected from the peripheral group of fields, the second number being greater than the first number;
wherein measuring the first number of overlay conditions comprises measuring only one overlay condition for only one overlay structure within the first field for alignment of a patterned layer on the wafer surface.

12. The method of claim 11, wherein at least one overlay condition is measured for at least one corresponding overlay structure in each of the plurality of fields over the semiconductor wafer surface.

13. The method of claim 11, wherein at least one overlay condition is measured for at least one corresponding overlay structure in at least 75% of the plurality of fields over the semiconductor wafer surface.

14. The method of claim 11, wherein measuring the second number of overlay conditions comprises measuring two or more overlay conditions for two or more overlay structures within the second field for alignment of the patterned layer on the wafer surface.

15. The method of claim 11, wherein the plurality of fields includes an intermediate group of fields which surround the central group of fields and which are surrounded by the peripheral group of fields, the method further comprising:
using the imager to measure a third number of overlay conditions at a corresponding third number of overlay structures within a third field selected from the intermediate group of fields, the third number being greater than the first number and less than the second number.

16. The method of claim 11, wherein the central group of fields includes a third field which includes a third number of overlay structures, and wherein the imager does not measure an overlay condition for any of the third number of overlay structures in the third field.

17. The method of claim 11, wherein the plurality of fields have equal field areas and are arranged so neighboring fields abut one another, wherein each field includes multiple overlay structures each made up of two or more layers that are to be aligned.

18. The method of claim 17, further comprising:
based on the measured first number of overlay conditions and the measured second number of overlay conditions, determining an alignment condition for the two or more layers.

19. A method for overlay sampling, comprising:
providing a plurality of fields over a semiconductor wafer surface, wherein the plurality of fields includes a first group of fields and a second group of fields surrounding the first group of fields, the first and second groups of fields being mutually exclusive and having at least one axis of symmetry passing through a central point on the semiconductor wafer surface;
using an imager to measure a first number of overlay conditions at a corresponding first number of overlay structures within a first field selected from the first group of fields; and
using the imager to measure a second number of overlay conditions at a corresponding second number of overlay structures within a second field selected from the second group of fields, the second number being larger than the first number;
wherein the first group of fields includes all fields within a perimeter defined by the second group of fields, and wherein each field in the first group of fields is measured only the first number of times for alignment of a patterned layer on the wafer surface.

20. The method of claim 19, wherein each field in the second group of fields is measured the second number of times, and the second number is at least two times as large as the first number.

* * * * *